United States Patent

Rivierre

[11] Patent Number: 6,014,056
[45] Date of Patent: Jan. 11, 2000

[54] POWER AMPLIFIER CIRCUIT WITH LOW DEGRADATION IN THE EVENT OF BREAKDOWNS

[75] Inventor: Bernard Rivierre, Fontenilles, France

[73] Assignee: Alcatel, Paris, France

[21] Appl. No.: 09/064,595

[22] Filed: Apr. 23, 1998

[30] Foreign Application Priority Data

Apr. 24, 1997 [FR] France ................................. 97 05070

[51] Int. Cl.[7] ................................. H03F 3/68; H03F 1/14
[52] U.S. Cl. ........................................ 330/124 R; 330/51
[58] Field of Search ................................. 330/51, 124 R, 330/124 D, 295

[56] References Cited

U.S. PATENT DOCUMENTS

| | | |
|---|---|---|
| 4,010,426 | 3/1977 | Rambo . |
| 4,618,831 | 10/1986 | Egami et al. ........................ 330/124 R |
| 5,083,094 | 1/1992 | Forsberg . |
| 5,610,556 | 3/1997 | Rubin . |
| 5,638,024 | 6/1997 | Dent et al. ........................... 330/124 R |
| 5,675,285 | 10/1997 | Winters ................................ 330/124 R |

FOREIGN PATENT DOCUMENTS 2284226 4/1976 France .

OTHER PUBLICATIONS

Patent Abstracts of Japan, vol. 009, No. 027 (E–294), Feb. 6, 1985 corresponding to JP 59 172816 A (Nippon Denki KK) Sep. 29, 1984.

*Primary Examiner*—Robert Pascal
*Assistant Examiner*—Patricia T. Nguyen
*Attorney, Agent, or Firm*—Sughrue, Mion, Zinn, Macpeak & Seas, PLLC

[57] ABSTRACT

The invention relates to a configuration of power amplifiers comprising firstly N inputs and N outputs, and secondly N amplification channels. The configuration is such that all of the amplification channels have substantially the same power even if the input signals are of different powers. Each amplification channel has at least one cell comprising two preferably identical amplifiers connected to first and second ports of a coupler having a third port constituting the output of the cell. An input coupler is preferably also provided having one port that constitutes the input of the cell and two other ports respectively connected to the inputs of the amplifiers. Each cell includes means for recombining the signals on the ports of the output coupler in such a manner as to maximize the output power in the event of one of the amplifiers breaking down.

12 Claims, 2 Drawing Sheets

POWER AMPLIFIER CIRCUIT WITH LOW DEGRADATION IN THE EVENT OF BREAKDOWNS

The present invention relates to a power amplifier circuit with low degradation in the event of breakdowns.

BACKGROUND OF THE INVENTION

In some fields, particularly in space technology, it is essential to make equipment in such a manner that inevitable breakdowns of components or elements do not give rise to significant degradation of equipment operation. To achieve that object, the general practice is to operate each component or element at its optimum power and to provide redundancy for said components or elements.

Thus, in telecommunications satellites, it is sometimes the practice to use a set of single-beam radiating elements (for transmission or reception) each of which is powered by a signal of well-determined amplitude and phase. Each radiating element is associated with one (or more) power amplifiers. Since the amplitudes of the signals supplied to the radiating elements can vary, it is not always possible to make each associated amplifier operate at its optimum power. To ensure that each amplifier is used under the best conditions, use is made of a "multiport amplifier" configuration.

One such configuration (FIG. 1) comprises an input Butler matrix 10 having a number of input ports $12_1, \ldots, 12_n$ equal to the number of radiating elements (not shown). The sum of the signal power applied to the inputs $12_1, \ldots, 12_4$ is, in general, constant. The Butler matrix is such that it delivers signals of equal power on its outputs $14_1$ to $14_4$ (the number of outputs being equal to the number of inputs).

Each output $14_1$ of the matrix 10 is associated with a power amplifier $16_i$ (or a set of such amplifiers) connected to an input $18_i$ of an output Butler matrix 20. The output matrix has outputs $22_i$ each of which is connected to a radiating element. The output matrix 20 performs the inverse function to the input matrix 10; thus, on each output $22_i$, there is to be found a signal that is the same as the signal applied to the corresponding input $12_i$ in phase and in amplitude (ignoring an amplification factor).

The amplifiers $16_i$ all operate at the same power. Naturally, this power corresponds to the optimum operating point. Usually they are identical to one another. To deal with breakdowns, the known configuration as shown in FIG. 1 includes extra amplifiers. Thus, in this example, the configuration has six amplifiers whereas the necessary number is four. The extra amplifiers are initially unused. In the event of breakdown, they are brought into the circuit, by means of switches $24_1, 24_2, \ldots, 26_1, 26_2, \ldots$. For example, amplifier $16_2{}'$ initially connects output $14_2$ of matrix 10 to input $18_2$ of matrix 20; after a breakdown is detected in that amplifier, the switches $24_2$ and $26_2$ are operated to take the amplifier $16_2{}'$ out of circuit and to bring into circuit the amplifier $16_2$ which was previously spare.

The spare amplifiers and the switches, which switches are usually electromechanical, constitute a troublesome increase of mass. In addition, replacing one amplifier by another gives rise to a change of phase due to the change in the path followed by the signals. This alters the signals at the outputs $22_i$ giving rise to a radiation pattern that is degraded in direction and in amplitude.

The state of the art is also shown by U.S. Pat. No. 5,610,556, in which the configuration includes in each channel between an output of the input matrix and the corresponding input of the output matrix, an amplifier cell comprising two identical amplifiers connected to two input ports of a coupler having a single output port which is connected to the input of the output matrix.

Unfortunately, that device does not make it possible to optimize the power of the cell in the event of one of the amplifiers failing.

OBJECTS AND SUMMARY OF THE INVENTION

The invention remedies those drawbacks. It makes it possible to keep down the number of amplifiers and to optimize the power of a cell in the event of an amplifier breakdown.

In the invention, each cell recombines the signals on the ports of the output coupler in such a manner as to maximize the output power in the event of one of the amplifiers breaking down, and the recombining occurs between each amplifier and the corresponding port of the output coupler.

In this way, firstly output power is maximized, and secondly if one of the amplifiers of the cell breaks down, the output from the coupler continues to deliver a signal whose phase is unaltered. In the event of application to a transmitter antenna, the disturbance to the direction of the radiation patterns will be minimized.

Preferably, each cell includes an input coupler having an input port connected to the corresponding output of the input Butler matrix and having its output ports connected to the inputs of the respective amplifiers.

In an embodiment, the drive of each amplifier can be modified; thus, in the event of an amplifier breakdown, the drive to the other amplifier is changed to cause it to deliver higher power.

In another embodiment, a switch, preferably a PIN diode, is connected in series between the output of each amplifier and the corresponding input port of the coupler, and the second output port of the coupler is loaded by an impedance via another switch. In the event of an amplifier breaking down, the switch in series with the amplifier is controlled so that the corresponding input port of the coupler is loaded by a short circuit and the output switch is controlled so that the second output port of the coupler is loaded either by a short circuit or by an open circuit, depending on which amplifier has broken down.

A single channel may include a plurality of cells in parallel. For example, if one channel has two cells in parallel, together they form a module having an input coupler and an output coupler, with each cell in the module performing the same role as each amplifier in a cell.

If both amplifiers in a cell break down, the other cell remains. If means are provided to recombine signals from the output coupler of the module, operation is the same as for a cell in which one of the amplifiers has broken down.

The invention is not limited to a multiport amplifier. It also extends to a power cell or module.

The preferred application of the amplifier lies in amplifying signals in locations where repairs are practically impossible, such as onboard satellites or spacecraft.

BRIEF DESCRIPTION OF THE DRAWINGS

Other characteristics and advantages of the invention appear from the description of various embodiments given below with reference to the accompanying drawings, in which.

MORE DETAILED DESCRIPTION

Figure 2:
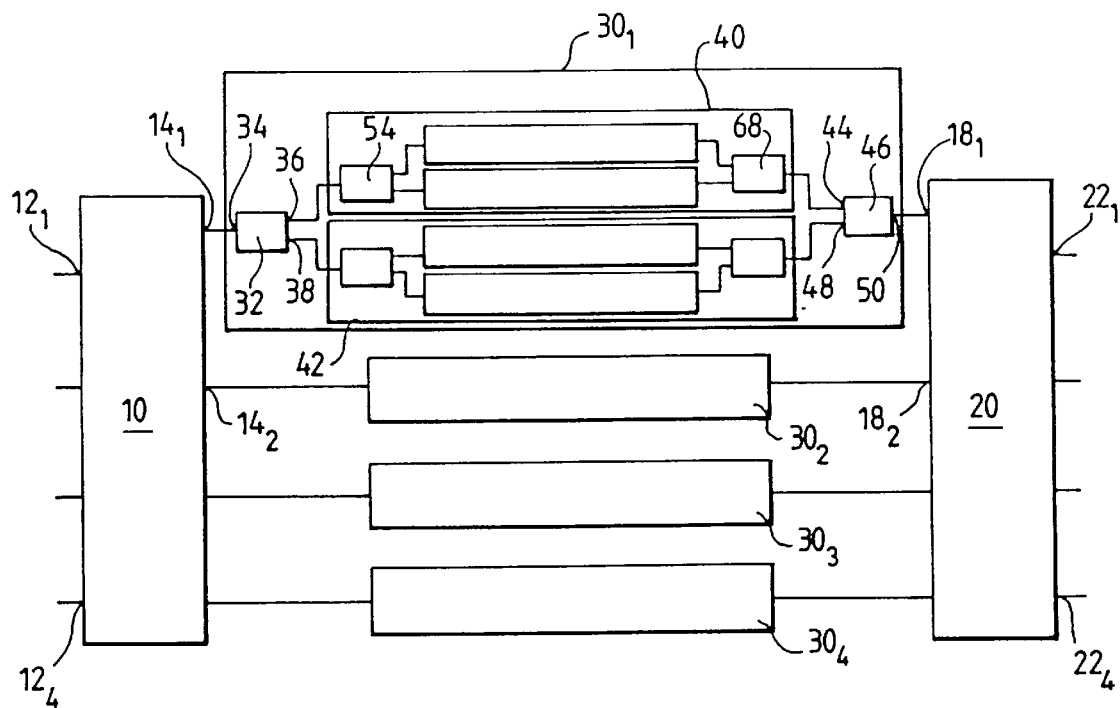
FIG. 2 is a block diagram of a configuration of the invention.

Reference is made initially to FIG. 2.

The multiport amplifier shown in FIG. 2 comprises, like a conventional multiport amplifier (FIG. 1), an input Butler matrix 10 and an output Butler matrix 20 having the same functions as the corresponding matrices of the conventional multiport amplifier, and the same references.

A power module $30_i$ is disposed between each output $14_i$ of the matrix 10 and the corresponding input $18_i$ of the matrix 20. In FIG. 2, the module $30_1$ is shown in some detail, while the other modules $30_2$, $30_3$, and $30_4$ are represented by respective blocks.

The module $30_1$ has an input coupler 32 of the three decibel (dB) and 90° phase shift type with two input ports and two output ports. The first input 34 receives the output signal $14_1$ from the matrix 10, while the second input (not shown) is connected to ground via an impedance, in a manner analogous to that described below with reference to FIGS. 3 to 5. The first output 36 from the coupler 32 is connected to the input of a first cell 40, while the second output 38 from the coupler is connected to the input of a second cell 42 identical to the cell 40. The cell 40 is described in greater detail below with reference to FIGS. 3, 4, and 5.

The output from the cell 40 is connected to the first input 44 of a (3 dB, 90°) coupler 46, while the output from the cell 42 is connected to the second input 48 of said coupler 46. The output 50 from the coupler 46 is connected to the input $18_1$ of the Butler matrix 20. The coupler 46 also has a second output (not shown) which is connected in like manner to the second output of the coupler of cell 40, as described below with reference to FIGS. 3 to 5.

Figure 3:
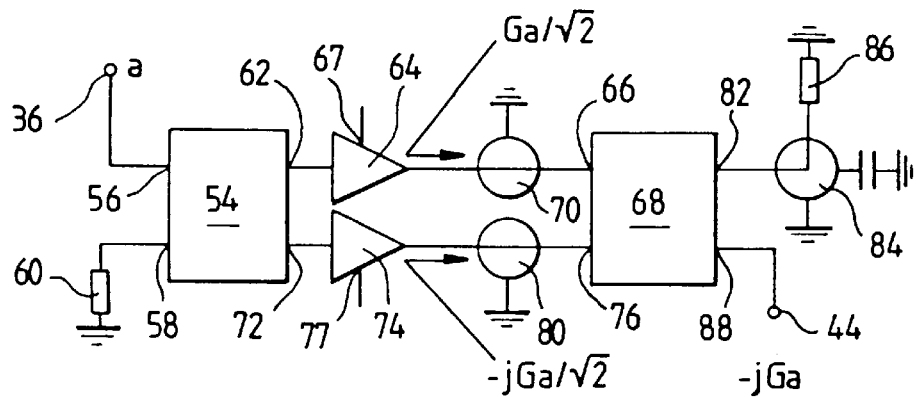
FIG. 3 is a block diagram of a cell in the FIG. 2 configuration, said cell being shown in its nominal operating state.

Reference is now made to FIG. 3 which shows the cell 40.

Figure 1:
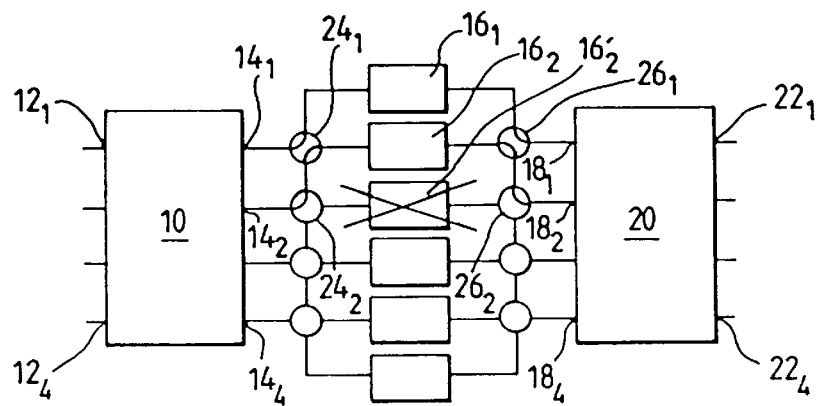
FIG. 1, described above, shows a known multiport amplifier.

The cell 40 comprises a (3 dB, 90°) input coupler 54, whose first input 56 receives the signal from the output 36 of the coupler 32 (FIG. 1). The second input 58 of the coupler 54 is connected to ground via a 50 ohm impedance 60.

The first output 62 from the coupler 54 is connected to the input of a first amplifier 64 having an input 67 for controlling its drive (or its gain). The output from the amplifier 64 is connected to the first input 66 of a (3 dB, 90°) output coupler 68 via a switch 70, e.g. a PIN diode.

Similarly, the second output 72 of the coupler 64 is connected to the input of an amplifier 74 having a drive or gain controlling input. The output from this amplifier is connected to the second input 76 of the coupler 68 via a switch 80, e.g. a PIN diode.

An output 82 from the coupler 68 is connected to ground via a switch 84 and a 50 ohm impedance 86. The other output 88 from the coupler 68 is connected to the input 44 of the coupler 46 (FIG. 2).

The above-described connections established via the switches 70, 80, and 84 correspond to nominal operation of the cell, i.e. when it has not broken down and both amplifiers 64 and 74 are operating properly.

Each output from an amplifier 64 or 74 is associated with a detector (not shown) providing an indication concerning the level of its output signal. These detectors are associated with control means (not shown) making it possible to change the positions of the switches 70, 80, and 84. Which particular change is made depends on which amplifier 64 or 74 breaks down.

Figure 4:
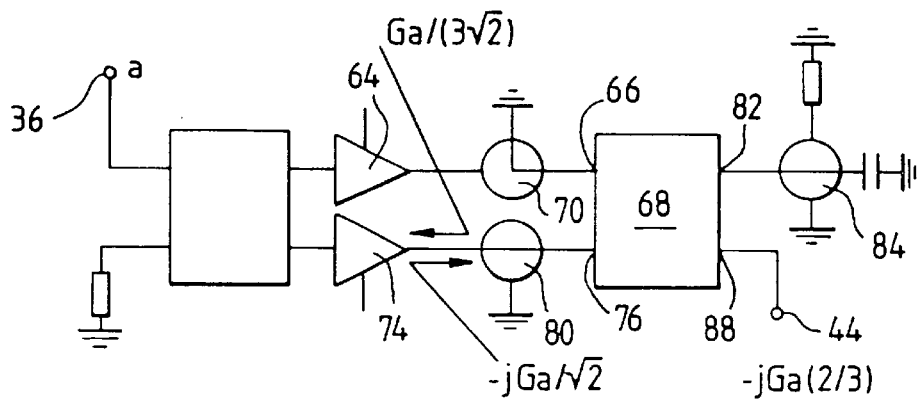
FIGS. 4 and 5 are block diagrams analogous to FIG. 3, but for degraded operation.
Figure 5:
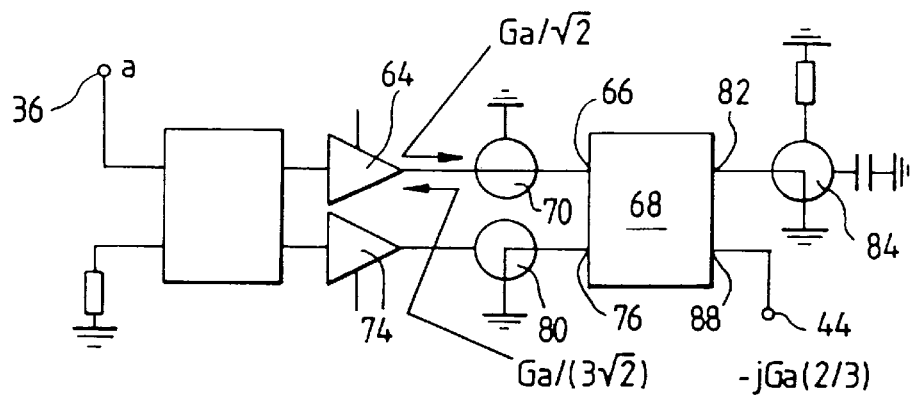

FIG. 4 corresponds to a breakdown of amplifier 64 while FIG. 5 corresponds to a breakdown of amplifier 74.

When amplifier 64 has broken down (FIG. 4), the output therefrom is disconnected from the input 66 of the coupler 68 and the switch 70 is positioned so that the input 66 is connected directly to ground, i.e. so that it is short-circuited. In contrast, the position of switch 80 is not changed, i.e. the output from amplifier 74 remains connected to the input 76 of the coupler 68. Finally, the output 82 from the coupler 68 is disconnected from the impedance 86. It an open circuit by appropriately controlling the switch 84.

When it is amplifier 74 that breaks down (FIG. 5) the output therefrom is disconnected from the input 76 of coupler 68 and said input is connected to ground, by appropriately controlling the switch 80. In contrast, the output from amplifier 64 remains connected to the input 66 of coupler 68.

Finally, the switch 84 is positioned so that the output 82 is short-circuited, i.e. it is connected to ground.

In nominal operation (FIG. 3), when a signal of value a is applied to input 56 of coupler 54, there appears a signal $a/\sqrt{2}$ on output 62, and a signal $-ja/\sqrt{2}$ on output 72, where j is the imaginary operator such that: $j_2 = -1$.

Under such conditions, a signal $Ga/\sqrt{2}$ is obtained on the output of amplifier 64 and a signal $-jGa/\sqrt{2}$ is obtained on the output of amplifier 74, where G is the gain of each of the amplifiers 64 and 74.

The value of the signal obtained on output 88 of coupler 68 is $-jGa$. This signal is thus in quadrature relative to the signal on the input 36.

When one of the amplifiers 64 or 74 breaks down, if the switches 70, 80, and 84 remain in the positions shown in FIG. 3, then the signal obtained on terminal 44 has the value $-jGa/2$. Thus, it is still a signal in quadrature with the input signal a, but the power of this signal is one-fourth the power obtained in nominal operation, whereas the power availability of the configuration has been halved only.

That is why, in the event of the breakdown, it is preferred to control the switches as described above when describing FIGS. 4 and 5.

As explained below, in each of the two cases shown in FIGS. 4 and 5, a signal is obtained on output 88 having the value $-jGa(\frac{2}{3})$. Under such conditions, the power delivered is $\frac{4}{9}$ the power of the output signal in nominal operation (FIG. 3).

This fraction $\frac{4}{9}$ is close to 50% which is the theoretical maximum that could be obtained after one of the amplifiers has broken down.

The value $-jGa(\frac{2}{3})$ obtained at the output 88 from the coupler 68 in FIGS. 4 and 5 can be explained by the following considerations and calculations.

A 3 dB, 90° coupler has four ports, each of which constitutes an inlet/outlet on each port of number i, a signal $a_i$ is input and a signal $b_i$ is output.

A coupler is such that the following matrix relationship exists between the signals input and output:

$$\begin{pmatrix} b_1 \\ b_2 \\ b_3 \\ b_4 \end{pmatrix} = \frac{1}{\sqrt{2}} \begin{pmatrix} 0 & 1 & 0 & \pm j \\ 0 & 0 & \pm j & 1 \\ 0 & \pm j & 0 & 1 \\ \pm j & 0 & 1 & 0 \end{pmatrix} \cdot \begin{pmatrix} a_1 \\ a_2 \\ a_3 \\ a_4 \end{pmatrix} \quad (1)$$

For a given coupler, all of the numbers j in the above 4·4 matrix are given the same sign (+ or −).

The above relationship (1) is applied to the coupler 68 in the circumstances of FIG. 4 (amplifier 64 broken down), using the following notation: the signals $a_1$ and $b_1$ appear on port 66, the signals $a_2$ and $b_2$ appear on port 82, the signals $a_3$ and $b_3$ appear on port 76, and the signals $a_4$ and $b_4$ appear on port 88.

The value of the output signal $b_4$ on port 88 is:

$$b_4 = \frac{1}{\sqrt{2}}(-ja_1 + a_3) \quad (2)$$

Taking account of the fact that:

(3) $a_1 = r_1 b_i$ where $r_1$ is the coefficient of reflection on port 66, and the fact that:

$$b_1 = \frac{1}{\sqrt{2}}(a_2 + ja_4) = \frac{1}{\sqrt{2}}a_2 = \frac{1}{\sqrt{2}}r_2 b_2 = \frac{1}{\sqrt{2}}r_2 \frac{1}{\sqrt{2}}(a_1 - ja_3) \quad (4)$$

$r_2$ is the coefficient of reflection on port 82, the following is obtained:

$$b_4 = \frac{1}{\sqrt{2}}\left(-j\left[\frac{r_1}{\sqrt{2}} \cdot \frac{r_2}{\sqrt{2}}(a_1 - ja_3)\right] + a_3\right) \quad (5)$$

I.e.:

$$b_4 = \frac{1}{\sqrt{2}}\left[-j\frac{r_1 r_2}{2}a_1 + a_3\left(1 - \frac{r_1 r_2}{2}\right)\right]$$

From above formulae (2) and (5) the following is deduced:

$$-ja_1 + a_3 = -j\frac{r_1 r_1}{2}a_1 + a_3\left(1 - \frac{r_1 r_2}{2}\right) \quad (6)$$

i.e.:

$$-ja_1\left(1 - \frac{r_1 r_2}{2}\right) = -a_3 r_1 \frac{r_2}{2}$$

whence:

$$a_1 = -ja_3 \frac{1}{2} r_1 \frac{r_2}{1 - \frac{1}{2}r_1 r_2} = -ja_3 r_1 \frac{r_2}{2 - r_1 r_2}$$

from which:

$$b_4 = \frac{a_3}{\sqrt{2}}\left(1 - \frac{r_1 r_2}{2 - r_1 r_2}\right) = \frac{a_3}{\sqrt{2}}\left(\frac{2 - 2r_1 r_2}{2 - r_1 r_2}\right)$$

given that $r_1$=1 (port 66 short-circuited), and $r_2$=−1 (port 82 open circuit):

$$b_4 = \frac{4a_3}{3\sqrt{2}}$$

since $$a_3 = -jGa/\sqrt{2},$$

the following is indeed obtained:

$$b_4 = -jGa \cdot \frac{2}{3}$$

In the context of FIG. 5, and still using relationship (1), the following is obtained:

$$b_2 = \frac{1}{\sqrt{2}}(a_1 - ja_3) = \frac{1}{\sqrt{2}}\left(a_1 - \frac{r_2 r_3}{\sqrt{2}}b_2\right) \quad (7)$$

In this formula, $r_2$ is the coefficient of reflection on port 82 and $r_3$ is the coefficient of reflection on port 76.

From this formula, it can be shown:

$$b_2 = a_1 \frac{\sqrt{2}}{2 + r_2 r_3} \quad (8)$$

In addition, the signal $b_4$ satisfies the following relationship:

$$b_4 = \frac{1}{\sqrt{2}}(-ja_1 + a_3) = \frac{1}{\sqrt{2}}\left(-ja_1 - jb_2 r_2 \frac{r_3}{\sqrt{2}}\right) \quad (9)$$

i.e.:

$$b_4 = -\frac{j}{\sqrt{2}}\left(a_1 + \frac{r_2 r_3}{\sqrt{2}}b_2\right)$$

whence:

$$b_4 = -\frac{j}{\sqrt{2}}a_1\left(1 + \frac{r_2 r_3}{2 + r_2 r_3}\right) = -\frac{1}{\sqrt{2}}a_1\left(\frac{2 + 2r_2 r_3}{2 + r_2 r_3}\right)$$

given that $r_2 = r_3 = 1$, it can be deduced:

$$b_4 = \frac{j}{\sqrt{2}} \frac{4}{3} a_1$$

since $a_1 = Ga/\sqrt{2}$, it follows that $b_4 = -jGa(2/3)$.

since $a_1$=Ga/√2, it follows that $b_4$=−jGa(⅔).

Under all circumstances, a signal is obtained on output 88 that always has the same phase, i.e. it is in quadrature relative to the signal a on input 56.

However, the reduction in the amplitude of the signal compared with nominal operation changes the signals obtained at outputs $22_1$ to $22_4$ of the matrix 20 (FIG. 2). To minimize this alteration of the output signals from the matrix 20, action is taken on the drive control input 67 or 77 of the amplifier 64 or 74 that is still working. This increase in drive applied to the amplifier increases its output power. Nevertheless, in general the resulting increase in power will not be enough to compensate for the loss due to the breakdown.

As mentioned above, the coupler 46 (FIG. 2) is associated with switches (not shown) analogous to the switches 70, 80, and 84 associated with the coupler 68 of the cell 40 or 42.

Under such conditions, when both amplifiers 64 and 74 of cell 40 break down, the switches associated with the coupler 46 take up the same positions as the switches 70, 80, and 84 shown in FIG. 4.

Similarly, when both amplifiers of the cell 42 break down, the switches associated with the coupler 46 take up the positions shown for the switches 70, 80, and 84 in FIG. 5.

It should be observed that in a given channel, between terminals 14$_i$ and 18$i$, it is possible to associate two modules 30$_1$ with even more input and output couplers (not shown).

It has been observed that in spite of the decrease in power that can result from breakdowns, the invention makes it possible to conserve phase relationships to an acceptable extent between the signals on the outputs 22$_1$ to 22$_4$ of the matrix 20, i.e. to conserve the necessary isolation between the various radiation patterns of an antenna.

I claim:

1. A power amplifier apparatus, comprising:

N input terminals and N output terminals;

an input matrix connected to N input terminals;

N amplification channels connected to the input matrix, wherein each amplification channel includes at least one cell, each cell comprising:

an input coupler connected to the input matrix, two amplifiers connected to the input coupler, signal switches connected to the outputs of the amplifiers, and an output coupler connected to the outputs of the signal switches; and an output matrix, connected to the output coupler of each cell, connected to N output terminals.

2. An apparatus according to claim 1, wherein a switch is disposed between each amplifier and the corresponding port of the output coupler, the switch corresponding to a failed amplifier being put into a position such that the corresponding port of the output coupler is short-circuited.

3. An apparatus according to claim 2, wherein the fourth port of the output coupler is loaded by an impedance via a third switch.

4. An apparatus according to claim 3, wherein the third switch of the output coupler connects to either short circuit or open circuit, dependent on which amplifier has failed.

5. An apparatus according to claim 2, wherein each switch is of the PIN diode type.

6. An apparatus according to claim 1, wherein each amplifier of a cell includes a power control input, which increases the power of an operable amplifier when the other amplifier has failed.

7. An apparatus according to claim 1, wherein each amplification channel includes at least two cells in parallel.

8. An apparatus according to claim 7, wherein the two parallel cells are connected to respective ports of a coupler.

9. An apparatus according to claim 8, including an input coupler having two input ports connected to respective inputs of the cells.

10. An apparatus according to claim 8, wherein the output signals from the cells received on the ports of the output coupler are recombined so as to maximize the output power in the event of simultaneous failure both amplifiers in one of the cells.

11. An apparatus according to claim 1, wherein a coupler has four ports for each of which there enters a signal $a_i$ and there leaves a signal $b_i$, wherein said signals are related by the following relationship:

$$\begin{pmatrix} b_1 \\ b_2 \\ b_3 \\ b_4 \end{pmatrix} = \frac{1}{\sqrt{2}} \begin{pmatrix} 0 & 1 & 0 & \pm j \\ 0 & 0 & \pm j & 1 \\ 0 & \pm j & 0 & 1 \\ \pm j & 0 & 1 & 0 \end{pmatrix} \cdot \begin{pmatrix} a_1 \\ a_2 \\ a_3 \\ a_4 \end{pmatrix} \quad (1)$$

j being the imaginary operator such that $j_2 = -1$.

12. An apparatus according to claim 1, further comprising input Butler matrix and an output Butler matrix.

* * * * *